(12) United States Patent
Schmid et al.

(10) Patent No.: US 8,268,544 B2
(45) Date of Patent: Sep. 18, 2012

(54) STAMP FOR PATTERNING, METHOD FOR MANUFACTURING SUCH STAMP AND METHOD FOR MANUFACTURING AN OBJECT USING THE STAMP

(75) Inventors: Heinz Schmid, Waedenswil (CH); Bruno Michel, Adliswil (CH); Urs Kloter, Dietikon (CH); Gerhard Keller, Charenton le Pont (FR); Jean-Paul Cano, Charenton le Pont (FR)

(73) Assignees: Essilor International (Compagnie Generale d'Optique), Charenton le Pont (FR); International Business Machines Corporation, Armonk, NY (US)

( * ) Notice: Subject to any disclaimer, the term of this patent is extended or adjusted under 35 U.S.C. 154(b) by 830 days.

(21) Appl. No.: 11/721,199

(22) PCT Filed: Dec. 1, 2005

(86) PCT No.: PCT/EP2005/013529
§ 371 (c)(1),
(2), (4) Date: Apr. 23, 2009

(87) PCT Pub. No.: WO2006/061255
PCT Pub. Date: Jun. 15, 2006

(65) Prior Publication Data
US 2009/0208882 A1    Aug. 20, 2009

(51) Int. Cl.
*G03F 7/26* (2006.01)
*B41F 31/00* (2006.01)
*B29C 47/00* (2006.01)

(52) U.S. Cl. ............................ 430/324; 101/327; 156/245

(58) Field of Classification Search ................... 430/324; 101/327; 156/245; 216/26
See application file for complete search history.

(56) References Cited

U.S. PATENT DOCUMENTS

| 2,748,696 A | | 6/1956 | Murray et al. |
|---|---|---|---|
| 4,508,031 A | * | 4/1985 | Rajnik ............................ 101/41 |
| 5,804,017 A | * | 9/1998 | Hector ......................... 156/242 |
| 5,817,242 A | | 10/1998 | Biebuyck et al. |

(Continued)

FOREIGN PATENT DOCUMENTS

DE        100 28 620        12/2001

(Continued)

OTHER PUBLICATIONS

Schmid et al., "Light-coupling masks for lensless, sub-wavelength optical lithography", Applied Physics Letters 72: 2379-381 (1998).
Delamarche et al., "Positive Microcontact Printing", American Chemical Society 124: 3834-835 (2002).

(Continued)

*Primary Examiner* — Brittany Raymond
(74) *Attorney, Agent, or Firm* — Occhiuti Rohlicek & Tsao LLP

(57) ABSTRACT

A stamp for patterning onto a receiving surface of an object (101) according to a defined pattern (P) comprises a stamping surface (21) of a resilient diaphragm (20). The stamping surface is planar at rest. The pattern is reproduced on the stamping surface and the diaphragm is affixed to a rigid body (13) along a peripheral edge, so that a middle part of the diaphragm can move along a direction perpendicular to the stamping surface. The diaphragm (20) is more flexible near the peripheral edge than in the middle part. Then, the pattern (P) printed on a pseudo-spherical receiving surface (103) using the stamp exhibits few distortion.

30 Claims, 3 Drawing Sheets

U.S. PATENT DOCUMENTS

| | | | |
|---|---|---|---|
| 5,925,259 | A | 7/1999 | Biebuyck et al. |
| 5,937,758 | A | 8/1999 | Maracas et al. |
| 5,948,621 | A * | 9/1999 | Turner et al. ............... 435/6.11 |
| 6,096,386 | A | 8/2000 | Biebuyck et al. |
| 6,180,239 | B1 | 1/2001 | Whitesides et al. |
| 6,517,995 | B1 | 2/2003 | Jacobson et al. |
| 2001/0013294 | A1 | 8/2001 | Bruno et al. |
| 2002/0140899 | A1 * | 10/2002 | Blum et al. ................. 351/159 |
| 2002/0191297 | A1 * | 12/2002 | Gleckman et al. ........... 359/629 |
| 2003/0047535 | A1 | 3/2003 | Schueller et al. |
| 2003/0196748 | A1 | 10/2003 | Hougham et al. |
| 2003/0213382 | A1 * | 11/2003 | Kendale et al. ............... 101/41 |
| 2004/0046927 | A1 * | 3/2004 | Montgomery ................ 351/46 |
| 2005/0139103 | A1 * | 6/2005 | Cracauer et al. ............. 101/327 |
| 2007/0001319 | A1 * | 1/2007 | Bauer et al. .................. 257/783 |

FOREIGN PATENT DOCUMENTS

| | | |
|---|---|---|
| EP | 0 794 016 | 9/1997 |
| WO | WO 96/29629 | 9/1996 |
| WO | WO 97/34025 | 9/1997 |

OTHER PUBLICATIONS

Kind et al., "Patterned Electroless Deposition of Copper by Microcontact Printing Palladium (II) complexes on Titanium-covered surfaces", Langmuir 16: 6367-373 (2000).

Massimo et al., "Using ultrathin elastomeric stamps to reduce pattern distortion in microcontact printing," Applied Physics Letters, American Institute of Physics, 81(11):2094-2096 (2002).

Xia et al., "Soft Lithography," Angewandte Chemie, International Edition, Verlag chemie 37:551-575 (1998).

* cited by examiner

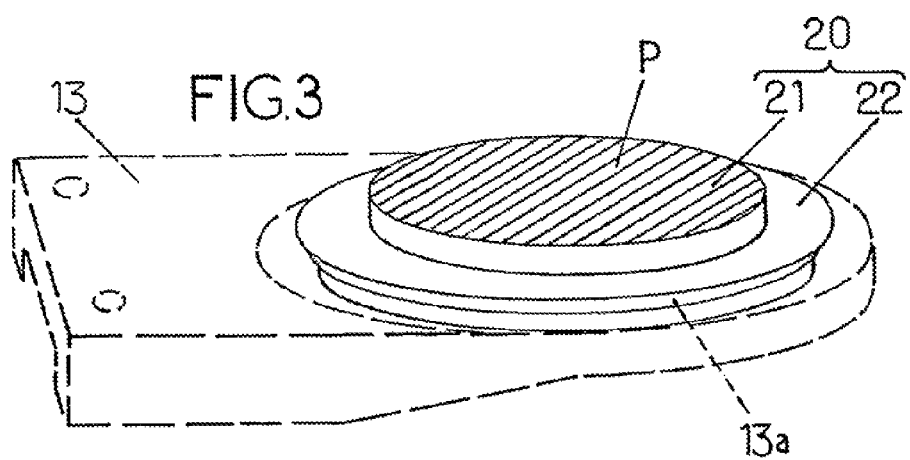
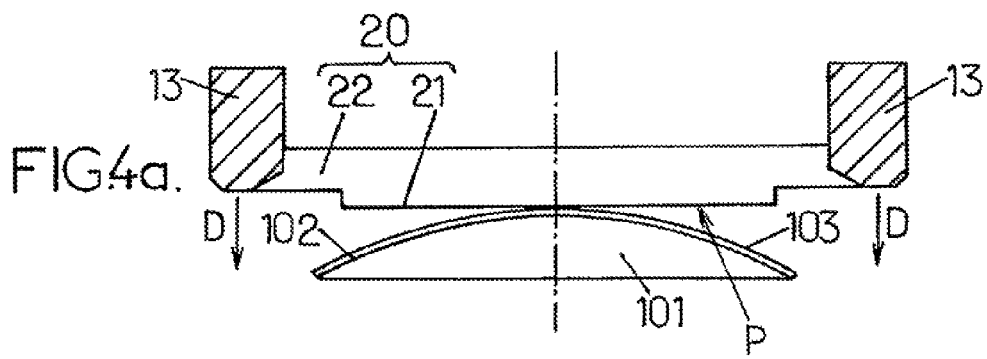
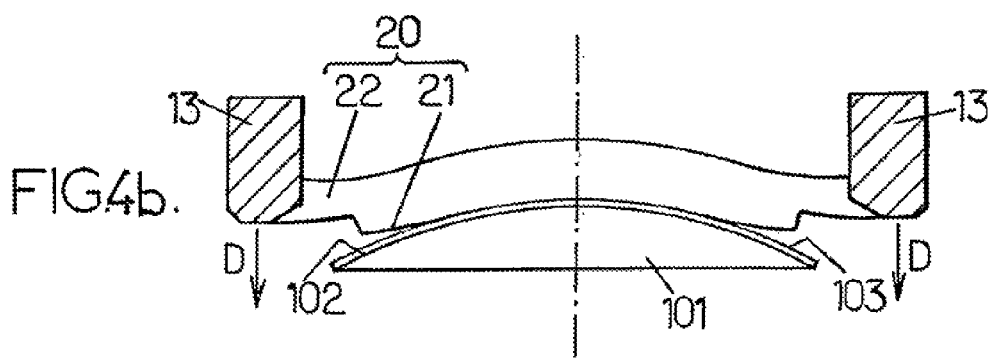
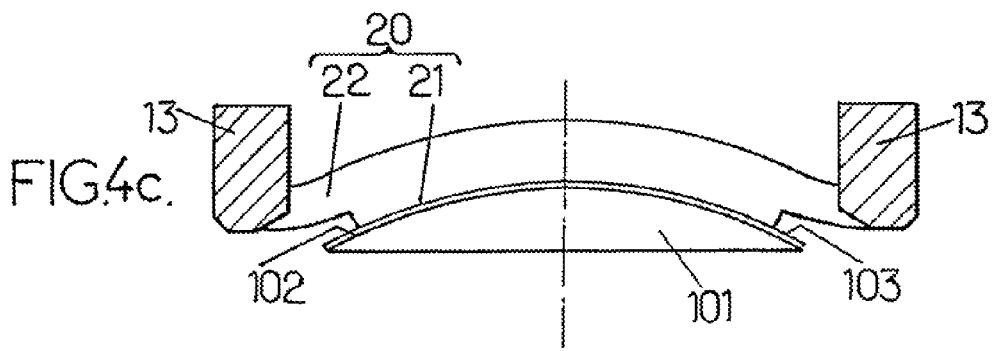

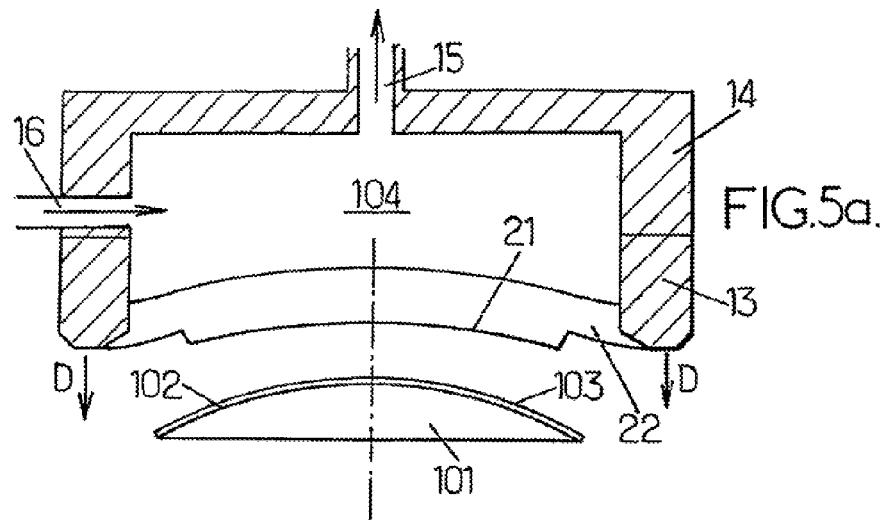
FIG.5a.
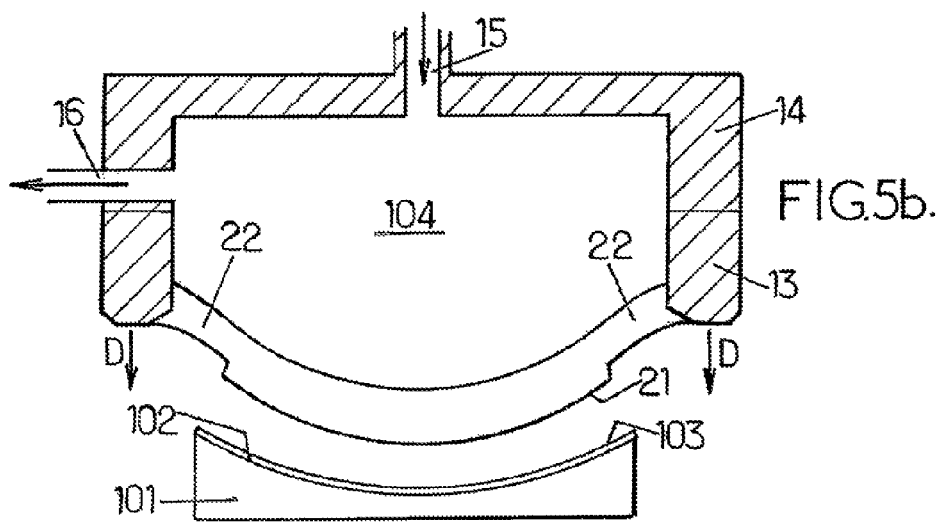
FIG.5b.
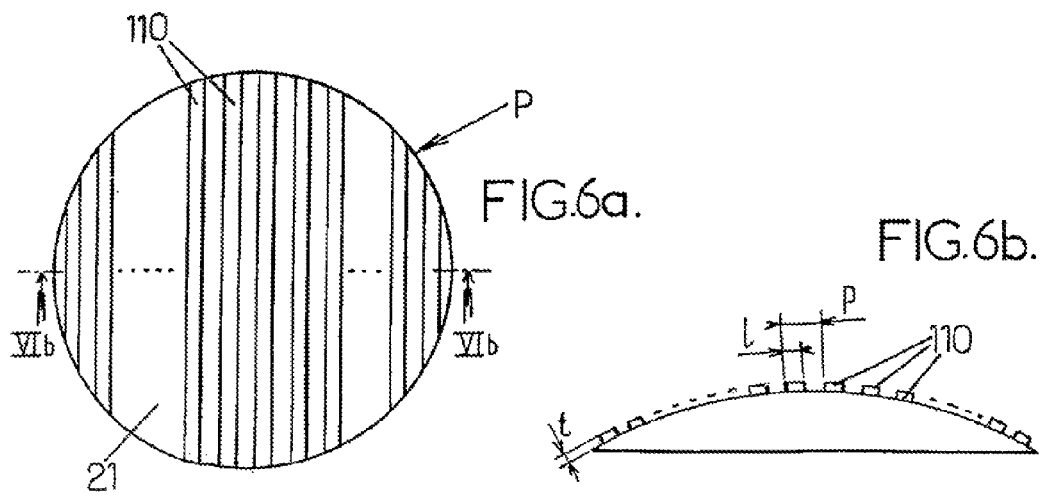
FIG.6a.
FIG.6b.

STAMP FOR PATTERNING, METHOD FOR MANUFACTURING SUCH STAMP AND METHOD FOR MANUFACTURING AN OBJECT USING THE STAMP

CROSS-REFERENCE TO RELATED APPLICATIONS

This application is being filed as a U.S. National Stage under 35 U.S.C. 371 of International Application No. PCT/EP2005/013529, filed on Dec. 1, 2005, which claims the benefit of European Application Serial No. 04292954.7, filed Dec. 10, 2004. The contents of both applications are hereby incorporated by reference in their entirety.

The present invention relates to a stamp for patterning a receiving surface and to a method for manufacturing such stamp. It also relates to a method for manufacturing an object, comprising a printing step performed by using a stamp according to the invention.

Soft lithography and in particular Micro-contact printing is a known process for reproducing a pattern rapidly and at low cost, in which the reproduction accuracy can be better than 0.50 µm (micrometres). It consists in pressing a stamping surface of a stamp impregnated with ink onto a surface of a receiver, so that ink is transferred from the stamping surface to the surface of the receiver according to the pattern.

U.S. Pat. No. 5,937,758 and US 2004/0011231-A1 disclose improvements of the micro-contact printing process for achieving large pattern prints. But these improved processes cannot be used for printing on spherical or pseudo-spherical surfaces. In the frame of the present invention, a pseudo-spherical surface refers to a continuous surface, i.e. without steps nor gaps, which is convex or concave. Then, a spherical surface is a particular case in which the curvature radii of the surface along two perpendicular directions are equal. Therefore, the expression of pseudo-spherical surfaces as used hereafter includes the case of spherical surfaces.

The document "Soft lithography", Y. Xia and G. M. Whitesides, Angew. Chem. Int. Ed., 37, 550-575 (1998), reports about micro-contact printing on non-planar surfaces. But the process described therein is not adapted for a pseudo-spherical receiver surface.

Finally, U.S. Pat. No. 5,669,303 discloses a stamp in which the stamping surface is convex. Such stamping surface gradually flattens against a receiver while the periphery of the stamping surface is held fixedly. Such gradual contact between the stamping surface and the receiver avoids the trapping of air bubbles, and may be used with pseudo-spherical receiving surfaces. But this method produces distorted pattern prints, due to the non-uniform distribution of the strains which are generated in the stamping surface during its application against the receiving surface.

Then, it is an object of the invention to provide a stamp for printing a pattern which can be used with a receiver of pseudo-spherical shape.

SUMMARY

The invention thus provides a stamp for patterning onto a receiver according to a defined pattern, comprising a stamping surface of a resilient diaphragm on which said pattern is reproduced. The stamping surface may be planar at rest or may have a shape adapted to the specific substrate to be printed. The diaphragm is affixed to a rigid body along a peripheral edge of said diaphragm so that points of a middle part of the diaphragm can move relative to the rigid body along a direction perpendicular to the stamping surface. Furthermore, the diaphragm is more flexible near the peripheral edge than in the middle part. In the context of the invention, it will be understood by "a movement along a direction perpendicular to the stamping surface" a movement of the diaphragm along an axis parallel to the normal passing through the central point of the stamping surface with a tolerance of ±20° in the angle.

Because a resilient diaphragm forms the stamping surface of a stamp according to the invention, the stamping surface can change in shape so that it conforms to the shape of the receiver when pressed against the latter. Then, the stamp can be used for printing the pattern on receiver surfaces that are pseudo-spherical.

Such change in shape of the stamping surface of the stamp may induce distortions of the pattern, in particular for receiver surfaces with short curvature radii. But these distortions are limited thanks to the providing of a peripheral part of the diaphragm which is more flexible, indeed, the strains of the diaphragm are mainly located in the most flexible peripheral part of the diaphragm, so that the pattern in the central part of the diaphragm is distorted only to a little extent during the pressing of the stamping surface against the receiver. Thus, the pattern can be printed on pseudo-spherical receiving surfaces with a high accuracy.

According to a preferred embodiment of the invention, the higher flexibility of the diaphragm near the peripheral edge is obtained by reducing the thickness of the diaphragm in this area. Thus, the diaphragm is thinner in a ring-shaped part near the peripheral edge than in a middle part surrounded by said ring-shaped part. Such method for varying the flexibility of the diaphragm between the peripheral part and the middle part is simple and can be implemented easily during the manufacturing of the stamp. Furthermore, once the variation in the flexibility of the diaphragm between the peripheral part and the middle part has been determined during the manufacturing of the stamp, it does not need to be controlled any longer during printing operations on receivers.

According to a another embodiment of the invention, the diaphragm comprises several resilient layers stacked along the direction perpendicular to the stamping surface, and the stamping surface pertains to the resilient layer which has the highest hardness among the diaphragm layers. Thus, the pattern is even less distorted when printed on a pseudo-spherical receiver surface. A bilayer structure for the diaphragm is particularly well suited for high resolution prints.

A stamp as described above is adapted for receiver surfaces which are convex. In this case, when pressing the stamping surface of the stamp against the receiver surface, the contact between the diaphragm and the receiver starts in the middle part of the stamp, and then expands radially. The inventors have determined that such operation reduces the distortion of the pattern print on the receiver.

A stamp according to the invention may also be adapted for concave receiver surfaces. To this end, the stamp may also comprise a sealed enclosure bound by the diaphragm, and means for varying a pressure inside the enclosure, so that a convex or concave shape of the stamping surface can be controlled via said pressure. Then, the shape of the stamping surface can be configured before printing, in accordance with the shape of the receiver surface. Such initial configuration of the shape of the stamping surface is useful for concave receiver surfaces, but it may also improve the pattern printing accuracy for convex receiver surfaces. The pressure in the enclosure is to be increased for printing on concave surfaces, so that the first contact between the stamping surface and the receiver surface occurs about the centre point of the stamp. For convex receiver surfaces, the pressure in the enclosure may be increased, but preferably decreased, in order to reduce the distortion of the diaphragm during its application on the receiver surface. The pattern print is thus less distorted.

The invention also provides a method for manufacturing such stamp which comprises the following steps:
- providing a mould bottom part with the pattern reproduced on a planar upper surface of said mould bottom part;
- placing a mould side part on top of the mould bottom part, so that an inner bottom edge of said mould side part surrounds the pattern, the mould side part comprising a lower mould side part and an upper mould side part with respective inner bores in line one with the other, the bore of one of the mould side parts being larger in cross section than the bore of the other mould side part;
- pouring at least one elastomer precursor into a mould comprising the mould bottom part and the mould side part superimposed, so as to form an elastomer diaphragm with a thickness greater than a bore height of the bottom side part; and
- fixing the diaphragm to a rigid body along a peripheral edge of the diaphragm corresponding to the largest bore of the lower and upper mould side parts.

Such stamp manufacturing method is simple and cheap, because it does not require any complex technical means. Furthermore, known technologies such as silicon wafer lithography may be used for reproducing the pattern on top of the mould bottom part, because the stamping surface is designed to be planar at rest.

Preferably, the bore of the upper mould side part is larger than the bore of the lower mould side part.

For enhanced ease of handling, the lower and the upper mould side parts are separate parts provided with means for bounding said lower and upper mould side parts in line one with the other.

According to a preferred implementation of the stamp manufacturing method, it further comprises the following step, before pouring the elastomer precursor:
- applying an adhesion promoter of the elastomer onto an inner surface of the mould side part having the largest bore.

Then, the mould side part with the largest bore is part of the rigid body of the stamp. The manufacturing of the stamp is then greatly simplified, as the diaphragm is produced directly affixed to the rigid body. This avoids a separate manufacturing step for fixing the diaphragm onto a rigid body. Furthermore, such additional fixing step could induce distortions of the pattern due to diaphragm permanent strains.

Advantageously, the mould side part with the largest bore is provided with an inner chamfer on which the adhesion promoter is applied. Thus, the applying of the adhesion promoter is performed more easily, so that it can be achieved uniformly. Then, the diaphragm is affixed quite evenly to the rigid body, yielding to a reduction in the distortions of the pattern prints.

The invention also provides to a method for manufacturing an object with a pattern printed on a pseudo-spherical receiving surface of this object, comprising the following steps:
- applying an ink onto the stamping surface of a stamp such as described above;
- pressing the stamping surface of the stamp against the receiving surface of the object;
- removing the stamp from the object; and
- processing the receiving surface by wet etching, or electroless plating.

According to this preferred embodiment of the invention, the ink is transferred from the stamp onto the substrate during the printing operation. The substrate is coated with a receiving layer that makes the receiving surface. The ink is made of molecules which protect the receiving layer against wet etching for example.

The invention may also be useful to implement near field optical lithography by using the stamp as contact phase mask, an example of such being described in the journal article "light-coupling masks for lensless, sub-wavelength optical lithography", Applied Physics Letters, volume 72, page 2379 (1998). In this case the resilient diaphragm of the stamp is made of siloxane type elastomer which is transparent to UV. Then according to this other embodiment, the invention also provides to a method for manufacturing an object (101) with a pattern (P) printed on a pseudo-spherical receiving surface (103) of said object, comprising the following steps:
- deposit a light adsorbing layer on the recessed stamping surface;
- applying a photoresist on the receiving surface;
- using the stamp as described before as light-coupling mask by pressing the stamping surface (21) against the receiving surface (103) of the object and expose the said stamp with UV light;
- removing the stamp from the object; and
- develop photoresist Such manufacturing methods are rapid and cheap. Indeed, the whole pattern is printed on the object in a single phase pressing step, with a one-dimensional motion of the stamp relative to the object. Then, they can be performed by using a quite simple motion control device.

Furthermore, the same stamp may be used for a wide range of curvature radii of the receiving surface of the object. The receiving surface may have a curvature radius greater than 55 mm (millimetres). In other words, a same stamp may be used for objects with respective receiving surfaces of different shapes.

Such manufacturing methods of an object are suitable for patterns with submicron details, thanks to the high accuracy of the prints which are obtained.

If the stamp is provided with a sealed enclosure and pressure adjustment means for making the stamping surface convex or concave, the method for manufacturing the object may further comprise the following step, before pressing the stamping surface of the stamp against the receiving surface of the object:
- adjusting the pressure inside the enclosure so that the stamping surface and the receiving surface have complementary shapes, and so that the pressing of the stamping surface against the receiving surface starts by contacting in the middle part of the stamping surface.

It is understood in the present invention that "complementary shapes" means:
- for a convex receiving surface, a curvature radius of the stamping surface which may be identical or superior to the curvature radius of said receiving surface;
- for a concave receiving surface, a curvature radius of the stamping surface which may be identical or inferior to the curvature radius of said receiving surface.

When using such improvement of the printing step, the same stamp can be used for receiving surfaces with very different curvatures, including convex and concave receiving surfaces. The variety in the shape of the object which is compatible with a same stamp is thus increased.

A useful application of the invention relates to the manufacturing of an optical lens with a pattern thereon. Indeed, an optical lens often has a pseudo-spherical surface, for modifying a vergence of a light impinging on the lens. The lens may also be an ophthalmic lens, i.e. any lens designed for eyewear, which can bring optical correction or not, which can be tinted or not. An ophthalmic lens may be afocal, unifocal, bifocal, trifocal or progressive.

BRIEF DESCRIPTION OF DRAWINGS

These and other aspects of the invention will become apparent from the non-limiting embodiments described hereafter in reference to the following drawings:

FIG. 3 is a perspective view of a stamp manufactured by using a mould according to FIG. 1;

FIGS. 4a-4c illustrate a step for printing a pattern on an ophthalmic lens according to the present invention;

FIGS. 5a and 5b illustrate two implementations of the printing step, respectively for a convex and a concave receiving surface; and FIGS. 6a and 6b are a top view and a cross sectional view of an ophthalmic lens with a pattern printed according to the invention.

In theses figures, identical reference numbers refer to identical elements, or to elements with similar function. Furthermore, for clarity reason, the sizes of the represented elements do not correspond to sizes of actual elements.

DETAILED DESCRIPTION

Figure 1:
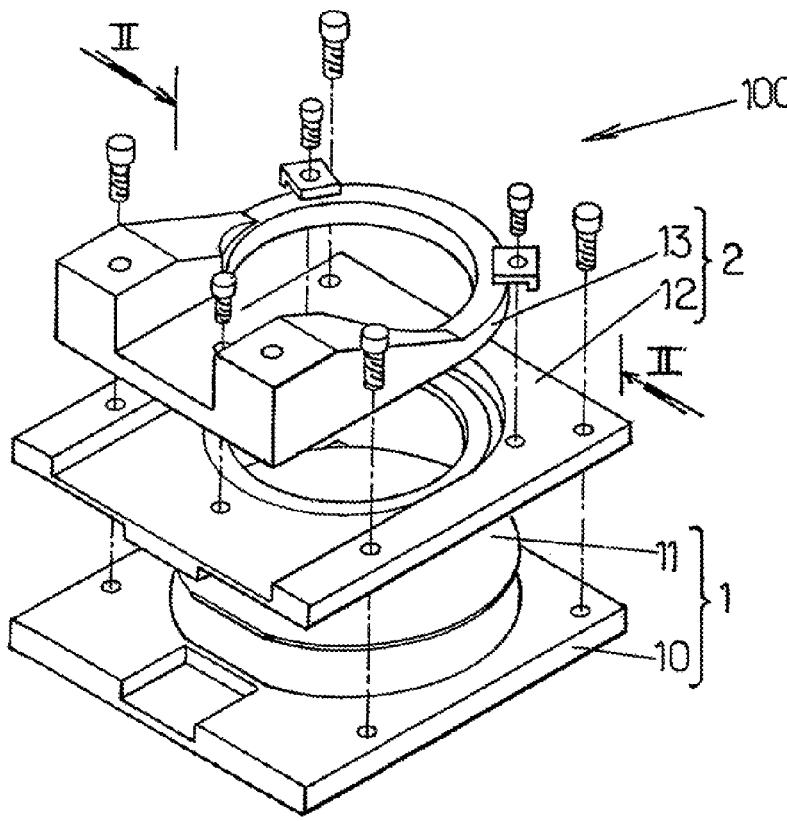
FIG. 1 is a perspective view of a mould for manufacturing a stamp according to the present invention.

The manufacturing process of a stamp is first described in detail, in reference to FIG. 1. A mould 100 for manufacturing the stamp comprises four parts, designed to be stacked in accurate alignment: a base 10, a master 11, a lower mould side part 12 and an upper mould side part 13. The parts 10, 12 and 13 may be out of aluminium, polyoxymethylene or any other material which is stable in shape and has adequate surface properties to promote or avoid adhesion with the elastomer. The base 10 together with the master 11 laid in a recess of the base form the mould bottom part 1 of the mould 100. The side parts 12 and 13 form the mould side part 2 of the mould 100. Mould parts 10-13 are provided with common assembling means, adapted for obtaining a mould 100 assembled with alignment accuracy down to 10 µm.

Advantageously, the master 11 consists in a silicon wafer of common use in microelectronics. For example, the wafer is about 10 cm in diameter. A pattern is reproduced on the top surface of the wafer using the photolithographic process, which is supposed to be known. The wafer is coated with a photoresist on its top surface, and then it is exposed to a UV radiation through a mask with transparent and opaque areas corresponding to the pattern. After the resist has been developed, the resist parts which remain on the wafer reproduce the pattern, with reproduction accuracy down to 0.02 µm. Then, the wafer can be used as the master 11 with the remaining resist parts, as far as the remaining resist parts have a well defined thickness and are strong enough not to deteriorate during the moulding of the stamp. Alternatively, the wafer is etched using a known process such as plasma etching or wet etching. Then, the resist is completely eliminated and the wafer is placed in the base 10 for use as the master 11. Thus, the pattern appears as being engraved on a top surface of the mould bottom part 1. An additional low energy surface coating or anti sticking layer is preferably applied on the wafer.

Figure 2:
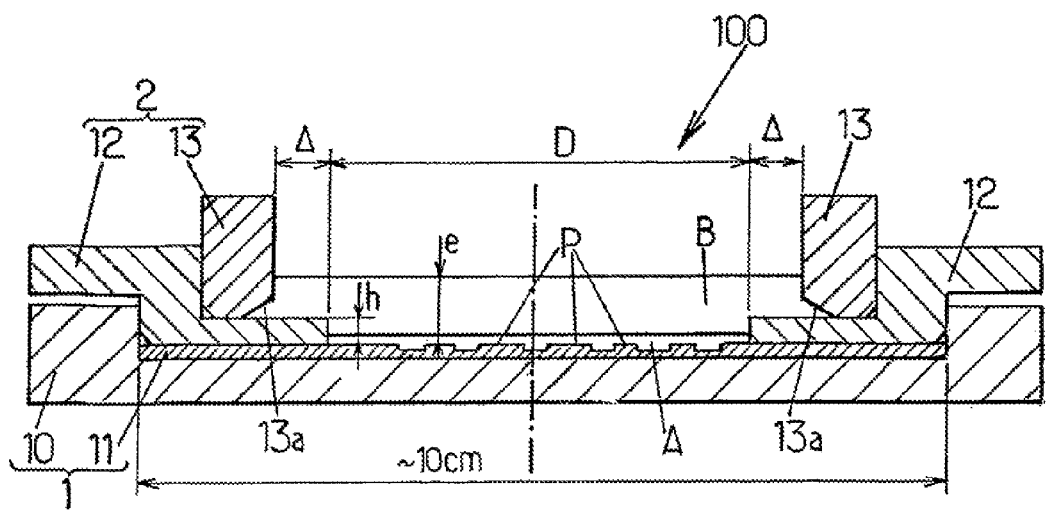
FIG. 2 is a cross sectional view of the mould of FIG. 1.

FIG. 2 is a cross sectional view of the mould 100 when assembled, along the plane II-II indicated in FIG. 1. The lower mould side part 12 has a first bore of cylindrical shape with an inner diameter D comprised between 10 mm and 100 mm. The height h of this first bore is comprised from 1.0 mm to 5.0 mm, for example. The upper mould side part 13 has a second bore of cylindrical shape with inner diameter of D+2Δ. Δ is comprised between 1 mm and 10 mm. The pattern is referenced P. It lies on the top surface of the master 11 within a circle of diameter D.

Once the mould 100 is firmly assembled, a first liquid elastomer is poured into the mould, so as to form a continuous liquid layer A above the master 11 in the first bore. The mould 100 may be spinned around its axis during the pouring of the first elastomer, in order to obtain an elastomer layer with uniform thickness. The first elastomer is dried within the mould 100. The bottom surface of layer A is conformal with the top surface of the master 11, so that the pattern P is reproduced on the bottom surface of the layer A. The amount of poured first elastomer is adjusted so that the thickness of layer A is comprised between 50 µm and 500 µm in at least an area corresponding to the pattern, after the first elastomer has been partly hardened, A second liquid elastomer is poured into the mould 100, so as to form another layer, referenced as B, above the layer A. Mould spinning may also be used. The second elastomer is hardened such as the two layers adhere together. The amount of poured second elastomer is adjusted so that the top surface of the layer B is higher than the upper edge of the first bore. In other words, the layers A and B have a total thickness e which is greater than the height h of the first bore. Typically, the total thickness of the layers A and B is selected from 1 mm to 10 mm.

Layers A and B form the resilient diaphragm of the stamp, and the bottom surface of layer A forms the stamping surface. The elastomer of layer A is chosen to be harder than the elastomer of layer B, so that the pattern P reproduced on the stamping surface experiences minimal mechanical deformation during stamping, even if the pattern P is quite fine. Layer B behaves as a soft backplane of layer A. Thus, the diaphragm can warp for matching the curvature of a receiver surface during a stamping operation.

The elastomer of layer B may be of siloxane type. For example, the commercial product named Sylgard® 184 and supplied by Dow Corning may be used. The Young modulus of layer B may be comprised between 0.5 and 2.5 MPa, which corresponds to a quite soft material. Hardening conditions of the Sylgard® 184 elastomer are indicated by the supplier.

The elastomer of layer A may be of siloxane type too, being modified so as to have a Young modulus of 5 to 15 MPa.

In another embodiment of the invention, the siloxane type elastomers of layer A and layer B may be transparent to UV. Sylgard® 184 for example fulfills this requirement by showing moderate absorption between 250 nm and 400 nm wavelength.

It is possible to pour the second elastomer into the mould 100 just after the first elastomer, and then to dry both layers A and B simultaneously. Drying at 60° C. during several hours to several days has been observed to be appropriate.

The assembling of the diaphragm with a rigid body used for handling and/or fixing on a printing press is greatly simplified if the stamp manufacturing method further comprises a step of applying an adhesion promoter of the second elastomer onto the inner surface of the upper mould side part 13. Such adhesion promoter is also called primer. It must be applied on the upper mould side part 13 before pouring the elastomers. Then, the upper mould side part 13 is used for handling and/or fixing the stamp. For the embodiment of the invention exemplified with FIGS. 1 and 2, the bore surface of the upper mould side part 13 is to be painted with an adhesion promoter. The adhesion promoter supplied by Dow Corning under reference primer 92-023 may be used, for example.

Advantageously, the mould side part having the largest bore, i.e. the mould part 13 in the present example, has an inner chamfer edge on which the adhesion promoter is applied. The chamfer is referenced 13*a* on FIG. 2. Thus, the adhesion promoter can be applied easily in the bore of the upper mould side part 13 before assembling of the mould 100, by wiping the chamfer 13*a* with a promoter applicator.

FIG. 3 shows a diaphragm 20 manufactured as described just above. The diaphragm 20 is affixed to the mould part 13 indicated with broken lines. The fixing surface of the diaphragm 20 comprises a slanted peripheral edge corresponding to the chamfer 13*a*. Reference number 21 indicates the stamping surface, on which the pattern P is engraved. The stamping surface 21 is surrounded with an elastomer ring 22 of reduced thickness. As for an example, the diaphragm 20 is of disk shape with at least 10 mm in diameter, preferably 70 mm. The thickness of the diaphragm in the stamping surface area is at least 1 mm, for example 3 mm, and the thickness of the diaphragm in the ring area is comprised between 0.5 mm and 2.0 mm. The difference in diaphragm thickness between the stamping surface area and the ring area corresponds to the height h of the bore of the lower mould size part 12. It is clear that the geometrical parameters and combination of geometrical parameters for mould 100 shall be adapted to the specific Young modulus values of materials A and B.

The manufacturing process of an object with a pattern printed on a pseudo-spherical receiving surface is now described, in reference to FIGS. 4*a*-4*c*. The receiving surface of the object has a curvature radius greater than 10 mm. For example, the object is an ophthalmic lens, with curvature radii for its convex or concave surface between 50 and 200 mm and a diameter of 55 to 80 mm. The lens may be of any material, including organic materials such as polyethylene or acrylate based materials.

An ink solution is to be selectively deposited using the stamp. The surface of the lens to be printed is initially coated with a layer which shows chemical affinity towards the ink such as chemisorption. The layer may be conductive. As conductive layer we can mention without limitation a layer made of metals selected from gold, silver, palladium, platinum, aluminium and copper. The conductive layer may also be of doped oxide, for example such as indium tin oxide. The material of the conductive layer is selected so as it can be etched later on. Known processes such as evaporation or sputtering can be used for the conductive layer deposition.

Then, the stamp is used for printing the pattern on the conductive layer with an ink designed for protecting the conducting layer from etching. The top surface of the conductive layer forms the receiving surface of the lens for the stamping process. Preferably, the ink is designed for forming a self-assembled molecular monolayer on the conductive layer. Such ink is very efficient for protecting the conductive layer against etching because of the very high density of the deposited ink layer. It comprises molecules which have a functional group that binds to the conductive material. A remainder part of each molecule, for example a long-chained hydrocarbon, interacts with neighbouring molecules to form a dense structure which is impenetrable by the etching agent. For example, hexadecanethiol ($C_{16}H_{34}S$) based ink, supplied by Sigma Aldrich, is appropriate with a gold layer deposited on the receiving surface of the lens.

The ink is transferred onto the stamping surface 21 by any known method, including direct inking, dipping into an ink tank and ink spraying. The ink excess on the stamping surface 21 is eliminated by blowing filtered air or nitrogen against the stamping surface.

Then, the stamping surface 21 is pressed onto the receiving surface of the lens, so that ink is deposited on the conductive layer at locations corresponding to the pattern. In FIGS. 4*a*-4*c*, D indicates the motion direction of the stamp towards the receiving surface. Reference numbers 101, 102 and 103 indicates the lens, the conductive layer and the receiving surface, respectively.

A vertical motion apparatus is used for controlling the parameters of the contact between the stamping surface 21 and the receiving surface 103. For example, lowering the stamp at speed 10 cm/s, with maximum pressing force of 30 N and average contact duration of 5 seconds are suitable parameters for achieving a contacting area of 65 mm in diameter if the receiving surface is convex with a 55 mm curvature radius, and if the diaphragm 20 has the dimensions indicated above.

FIG. 4*a* illustrates the situation when the stamping surface 21 of the diaphragm 20 starts contacting the receiving surface 103 of the lens 101. At this time, the diaphragm is not strained and the contact occurs at a single point located on the axis of the lens. As the rigid body 13 is lowered along direction D, the diaphragm 20 is pushed against the receiving surface 103. It becomes warped in a middle part of the diaphragm 20 so as to conform with the curvature of the lens 101 (FIG. 4*b*). In this way, a contact area between the stamping surface 21 and the receiving surface 103 expands progressively, and the capture of air bubbles is thus avoided. The peripheral ring 22 is continuously strained. Then, as the rigid body 13 is further lowered, the diaphragm 20 becomes warped in the whole stamping area 21, and the ring 22 is further strained (FIG. 4*c*). In fact, the ring 22 concentrates a main part of the strain of the diaphragm 20, because of its reduced thickness. The pattern P on the stamping surface 21 is thus distorted to only a small extent.

Optionally, the strain of the stamping surface 21 may be optically monitored during the pressing of this surface against the receiving surface 103.

FIGS. 5*a* and 5*b* illustrate an implementation of the invention in which the stamp further comprises a sealed enclosure 104 bound by the diaphragm 20. The enclosure 104 is formed by adapting a cap 14 above the rigid body 13. The shape of the stamping surface 21 can be controlled via the air pressure in the enclosure 104, using the aperture 15. For a lens 101 with a convex receiving surface 103, the stamping surface 21 can be made concave in a preliminary step, with an absolute curvature radius greater than the absolute curvature radius of the receiving surface 103 (FIG. 5*a*). This is achieved by reducing the air pressure within the enclosure 104 using the aperture 15. Thus, the diaphragm 20 is initially already strained, and the residual strain of the stamping surface 21, which occurs when the stamp is lowered against the receiving surface 103, is reduced. This reduction in the residual strain of the stamping surface 21 improves the quality of the pattern printed on the receiving surface. This results from a strain of the stamping surface 21 which is distributed more uniformly thank to air pressure control, and from the fact that less sliding of the diaphragm 20 on the receiving surface 103 occurs during the stamping operation. Optionally, the cap 14 can have an additional small bore 16 that allows regulating the pressure difference during the stamping operation.

When the receiving surface 103 is concave (FIG. 5*b*), the stamping surface 21 is made initially convex with an absolute curvature radius smaller than the absolute curvature radius of the receiving surface. This is achieved by increasing the air pressure within the enclosure 104 using the aperture 15. When this pressure is higher than the pressure outside the enclosure 104, the stamping surface becomes convex. Then, when lowering the stamp along direction D, the stamping surface 21 penetrates into the receiving surface 103, so that the contact first occurs at the centre point of the stamping surface. Optionally, the cap 14 can have an additional small bore 16 that allows regulating the pressure difference during the stamping operation.

After the stamp has been removed from the object, the receiving surface 103 of the lens 101 is contacted with an etching agent, so that the conductive layer 102 is etched at points of the receiving surface where no ink has been deposited during the stamping operation. Known processes as wet etching can be used, depending on the material of the conductive layer. In particular, a solution containing ferric nitrate ($Fe(NO_3)_3$) at 40 mMole/litre and thiourea ($CH_4N_2S$) at 60 mMole/litre is appropriate for etching a gold layer at ambient temperature. It is also possible to use a pH-controlled cyanide solution as etching solution. After etching, the conductive layer 102 remains only at points where it has been covered with ink deposited by the stamp, according to the pattern P.

FIGS. 6a and 6b illustrate an example of pattern P printed on the receiving surface 103 of the lens 101. FIG. 6b is a cross sectional a view of the lens 101 according to the arrows VIb indicated on FIG. 6a. The pattern P is a linear conductive grid, consisting in a set of parallel conductive lines 110. Each line corresponds to a remaining part of the conductive layer 102. Advantageously, the grid has a pitch p within the range 0.1 μm to 0.4 μm, preferably 0.14 μm to 0.25 μm. Then, no diffraction occurs for a visible light impinging on the lens 101, so that the lens complies with the aesthetic requirement of ophthalmic lenses. The grid generates a partially polarizing effect of a light impinging on the optical lens. In known manner, such polarizing effect may be useful for reducing a glare produced by a planar reflecting surface. Other features of the grid may be:

grid lines out of silver or aluminium, corresponding to the material of the layer 102;
thickness t of the lines more than 30 nm (nanometres), corresponding to the thickness of the layer 102;
width of the lines less than 0.15 μm, defined by the pattern P reproduced on the stamping surface 21; and
visible transmission of the lens within the range 16 to 95% for a light component polarized perpendicular to the grid lines, and within the range 0 to 5% for a light component polarized parallel to the grid lines.

It is clear that the geometrical parameters of the polarizing linear grid shall be adapted to the specific nature of the conductive layer 102

This pattern example is given only for illustrative purpose. Other patterns may be printed on lenses, with functions other than polarizing. Using the manufacturing method of the invention, the inventors have also produced lenses for operation with infrared light, typically of 1.3 μm or 1.5 μm in wavelength.

Furthermore, it is clear that the invention described in details may be adapted or modified in order to comply with special applications and various embodiments of Soft Lithography techniques. For example, the pattern may be printed positively or negatively, in a manner that can be immediately derived from the implementation described. In particular, it is straightforward to use the invention in order to implement the technique so called "Positive Micro contact Printing", an example of such being described in the article "Positive Microcontact Printing", in the Journal of the American Chemical Society, volume 124, page 3834 (2002)

The invention may also be useful to implement the technique so called "Electroless deposition" by using specific catalyst molecules as ink on the stamp, an example of such being described in the journal article "Patterned Electroless Deposition of Copper by Microcontact Printing Palladium (II) complexes on Titanium-covered surfaces", Langmuir volume 18, page 6367 (2000).

The invention may also be useful to implement micromolding techniques such as UV embossing or thermal embossing, several examples of which being described in the journal article, "Soft lithography", Angew. Chem. Int. Ed. 37, 550-575 (1998). In the particular case of UV embossing, the elastomeric materials of the stamp have to show reasonable transparency to the UV light. Then in another embodiment the invention provides a method for manufacturing an object (101) with a pattern (P) printed on a pseudo-spherical receiving surface (103) of said object, comprising the following steps:

applying a polymerizable liquid on the receiving surface;
using the stamp which comprises siloxane type elastomer which is transparent to UV;
pressing the stamping surface (21) against the receiving surface (103) of the object and harden the liquid with UV light; and
removing the stamp from the object.

In a same manner an object of the invention is also a method for manufacturing an object (101) with a pattern (P) printed on a pseudo-spherical receiving surface (103) of said object, comprising the following steps:

applying a polymerizable liquid on the stamping surface;
using the stamp which comprises siloxane type elastomer which is transparent to UV;
pressing the stamping surface (21) against the receiving surface (103) of the object and harden the liquid with UV light; and
removing the stamp from the object.

It is clear that in both molding methods cited above, thermal curing of the polymerizable liquid can also be implemented.

The invention claimed is:

1. Stamp for patterning onto a receiver according to a defined pattern (P), comprising a stamping surface of a resilient diaphragm which is planar at rest and on which said pattern is reproduced, the diaphragm being affixed to a rigid body along a peripheral edge of said diaphragm so that points of a middle part of the diaphragm are movable relative to the rigid body along a direction perpendicular to the stamping surface, the stamp being characterized in that the diaphragm is more flexible near the peripheral edge than in the middle part, wherein the diaphragm comprises several resilient layers stacked along the direction perpendicular to the stamping surface,
the stamping surface is formed of the resilient layer having the highest hardness among said layers of the diaphragm, and
the resilient layer with the highest hardness has a thickness which is comprised between 50 μm and 500 μm in at least an area of the stamping surface corresponding to the pattern (P).

2. Stamp according to claim 1, wherein the diaphragm is thinner in a ring-shaped part near the peripheral edge than in a middle part surrounded by said ring-shaped part.

3. Stamp according to any one of the claim 2, wherein the diaphragm is of disk shape with at least 10 mm in diameter, with a thickness of at least 2.5 mm in said stamping surface area of the diaphragm, and with a thickness comprised between 0.5 mm and 2.0 mm in the ring-shaped part.

4. Stamp according to claim 3, wherein said ring-shaped part of the diaphragm has a difference between a large diameter and a small diameter comprised between 1 mm and 10 mm.

5. Stamp according to claim 1, further comprising a sealed enclosure bound by the diaphragm, and means for varying a pressure inside the enclosure, so that a convex or concave shape of the stamping surface can be controlled via said pressure.

6. Stamp according to claim 1, wherein at least part of the resilient diaphragm is made of siloxane type elastomer.

7. Stamp according to claim 6 wherein the siloxane type of elastomer is transparent to UV.

8. Method for manufacturing a stamp comprising the following steps: —providing a mould bottom part with a pattern (P) reproduced on a planar upper surface of said mould bottom part;
  placing a mould side part on top of the mould bottom part, so that an inner bottom edge of said mould side part surrounds the pattern (P), the mould side part comprising a lower mould side part and an upper mould side part with respective inner bores in line one with the other, the bore of one of the mould side parts being larger in cross section than the bore of the other mould side part;
  pouring at least one elastomer precursor into a mould comprising the mould bottom part and the mould side part superimposed so as to form an elastomer diaphragm with a thickness (e) greater than a bore height (h) of the bottom side part; and
  fixing the diaphragm to a rigid body along a peripheral edge of the diaphragm corresponding to the largest bore of the lower and upper mould side parts,
  wherein the diaphragm comprises several resilient layers stacked along the direction perpendicular to a stamping surface,
  the stamping surface is formed of the resilient layer having the highest hardness among said layers of the diaphragm, and
  the resilient layer with the highest hardness has a thickness which is comprised between 50 µm and 500 µm in at least an area of the stamping surface corresponding to the pattern (P).

9. Method for manufacturing a stamp according to claim 8, wherein the pattern (P) is engraved on a top surface of the mould bottom part.

10. Method for manufacturing a stamp according to claim 8, wherein the bore of the upper mould side part is larger than the bore of the lower mould side part.

11. Method for manufacturing a stamp according to claim 8, further comprising the following step, before pouring the elastomer precursor,
  applying an adhesion promoter of the elastomer onto an inner surface of the mould side part having the largest bore, wherein said mould side part with the largest bore is part of said rigid body.

12. Method for manufacturing a stamp according to claim 11, wherein the mould side part having the largest bore is provided with an inner chamfer on which the adhesion promoter is applied.

13. Method for manufacturing a stamp according to claim 8, wherein the lower and the upper mould side parts are separate parts provided with means for bounding said lower and upper mould side parts in line one with the other.

14. Method for manufacturing an object with a pattern (P) printed on a pseudo-spherical receiving surface of said object, comprising the following steps:
  applying an ink onto the stamping surface of a stamp according to claim 1;
  pressing the stamping surface of the stamp against the receiving surface of the object;
  removing the stamp from the object; and
  processing the receiving surface by wet etching or electroless plating.

15. Method for manufacturing an object according to claim 14, wherein said receiving surface has a curvature radius greater than 55 mm and is convex or concave.

16. Method for manufacturing an object according to anyone of the claim 14, further comprising the following step, before pressing the stamping surface of the stamp against the receiving surface of the object:
  adjusting the pressure inside the enclosure so that the stamping surface and the receiving surface have complementary shapes, and so that the pressing of the stamping surface against the receiving surface starts by contacting in the middle part of the stamping surface.

17. Method for manufacturing an object according to claim 14, wherein a strain of the stamping surface is optically monitored during the pressing of the stamping surface against the receiving surface.

18. Method for manufacturing an object according to claim 14, wherein the ink is designed for forming a self-assembled molecular monolayer on a conductive layer.

19. Method for manufacturing an object according to claim 18, wherein the conductive layer is a metal layer.

20. Method for manufacturing an object according to claim 19, wherein the metal is selected from gold, silver, palladium, platinum, aluminium and copper.

21. Method for manufacturing an object according to claim 14, wherein the ink is a solution of catalyst molecules.

22. Method for manufacturing an object according to claim 14, wherein said object comprises an optical lens.

23. Method for manufacturing an object according to claim 22, wherein said optical lens is an ophthalmic lens.

24. Method for manufacturing an object according to claim 22, wherein the pattern (P) comprises a linear conductive grid.

25. Method for manufacturing an object according to claim 24, wherein the grid has a pitch (p) within the range 0.1 µm to 0.4 µm.

26. Method for manufacturing an object according to claim 25, wherein the grid pitch (p) is within the range 0.14 µm to 0.25 µm.

27. Method for manufacturing an object according to claim 24, wherein the grid comprises parallel conductive lines which are more than 30 nm thick (t).

28. Method for manufacturing an object according to claim 24, wherein the grid lines are less than 0.15 µm broad (I).

29. Method for manufacturing an object according to claim 24, wherein the grid generates a at least partially polarizing effect of a light impinging on the optical lens.

30. Method for manufacturing an object according to claim 29, wherein a visible transmission of the lens is within the range 16% to 95% for a light component polarized perpendicular to the grid lines, and within the range 0% to 5% for a light component polarized parallel to the grid lines.

* * * * *

UNITED STATES PATENT AND TRADEMARK OFFICE
CERTIFICATE OF CORRECTION

| | | |
|---|---|---|
| PATENT NO. | : 8,268,544 B2 | Page 1 of 1 |
| APPLICATION NO. | : 11/721199 | |
| DATED | : September 18, 2012 | |
| INVENTOR(S) | : Heinz Schmid et al. | |

It is certified that error appears in the above-identified patent and that said Letters Patent is hereby corrected as shown below:

Title Page please insert -- (30) Foreign Application Priority Data:
December 10, 2004    (EP)..................................................04292954.7 --

Signed and Sealed this
Nineteenth Day of February, 2013

Teresa Stanek Rea
*Acting Director of the United States Patent and Trademark Office*